(12) United States Patent
Yasumatsu

(10) Patent No.: US 9,583,304 B2
(45) Date of Patent: Feb. 28, 2017

(54) PROCESSING APPARATUS AND SHIELD

(71) Applicant: CANON ANELVA CORPORATION, Kawasaki-shi (JP)

(72) Inventor: Yasushi Yasumatsu, Inagi (JP)

(73) Assignee: CANON ANELVA CORPORATION, Kawasaki-Shi, Kanagawa (JP)

(*) Notice: Subject to any disclaimer, the term of this patent is extended or adjusted under 35 U.S.C. 154(b) by 103 days.

(21) Appl. No.: 14/290,296

(22) Filed: May 29, 2014

(65) Prior Publication Data

US 2014/0262766 A1    Sep. 18, 2014

Related U.S. Application Data

(63) Continuation of application No. PCT/JP2012/006743, filed on Oct. 22, 2012.

(30) Foreign Application Priority Data

Dec. 15, 2011  (JP) ................. 2011-275072

(51) Int. Cl.
*H01J 37/34* (2006.01)
*H01J 37/09* (2006.01)
(Continued)

(52) U.S. Cl.
CPC .......... *H01J 37/09* (2013.01); *C23C 14/3407* (2013.01); *H01J 37/32651* (2013.01); *H01J 37/3411* (2013.01); *H01J 37/3447* (2013.01)

(58) Field of Classification Search
CPC ................................................. H01J 37/3411
See application file for complete search history.

(56) References Cited

U.S. PATENT DOCUMENTS

2004/0026242 A1* 2/2004 Marszal ............ H01J 37/32055
204/298.41
2004/0168631 A1  9/2004 Honjou et al.
(Continued)

FOREIGN PATENT DOCUMENTS

JP    3-006365 A    1/1991
JP    6-196476 A    7/1994
(Continued)

OTHER PUBLICATIONS

International Search Report (PCT/ISA/210) mailed on Nov. 13, 2012, by the Japanese Patent Office as the International Searching Authority for International Application No. PCT/JP2012/006743.
(Continued)

*Primary Examiner* — Keith Hendricks
*Assistant Examiner* — Timon Wanga
(74) *Attorney, Agent, or Firm* — Buchanan Ingersoll & Rooney PC

(57) ABSTRACT

A processing apparatus for processing a substrate in a vacuum processing space in a chamber includes a shield arranged in the chamber, and a holding portion configured to hold the shield by a magnetic force. The holding portion has a holding surface on which a first magnet is arranged. The shield includes a second magnet configured to generate an attraction force with respect to the first magnet, and a receiving portion configured to receive a tool configured to move the shield with respect to the holding portion.

20 Claims, 11 Drawing Sheets

(51) Int. Cl.
*C23C 14/34* (2006.01)
*H01J 37/32* (2006.01)

(56) References Cited

U.S. PATENT DOCUMENTS

| | | | | |
|---|---|---|---|---|
| 2005/0185359 | A1* | 8/2005 | Wickramanayaka | H01L 21/68721 |
| | | | | 361/234 |
| 2009/0304931 | A1 | 12/2009 | Uenosono | |
| 2009/0308317 | A1 | 12/2009 | Sone et al. | |

FOREIGN PATENT DOCUMENTS

| | | |
|---|---|---|
| JP | 2003-183810 A | 7/2003 |
| JP | 2004-214624 A | 7/2004 |
| JP | 2009-293074 A | 12/2009 |
| WO | WO 2009/153856 A1 | 12/2009 |

OTHER PUBLICATIONS

Written Opinion (PCT/ISA/237) mailed on Nov. 13, 2012, by the Japanese Patent Office as the International Searching Authority for International Application No. PCT/JP2012/006743.

* cited by examiner

F I G. 1
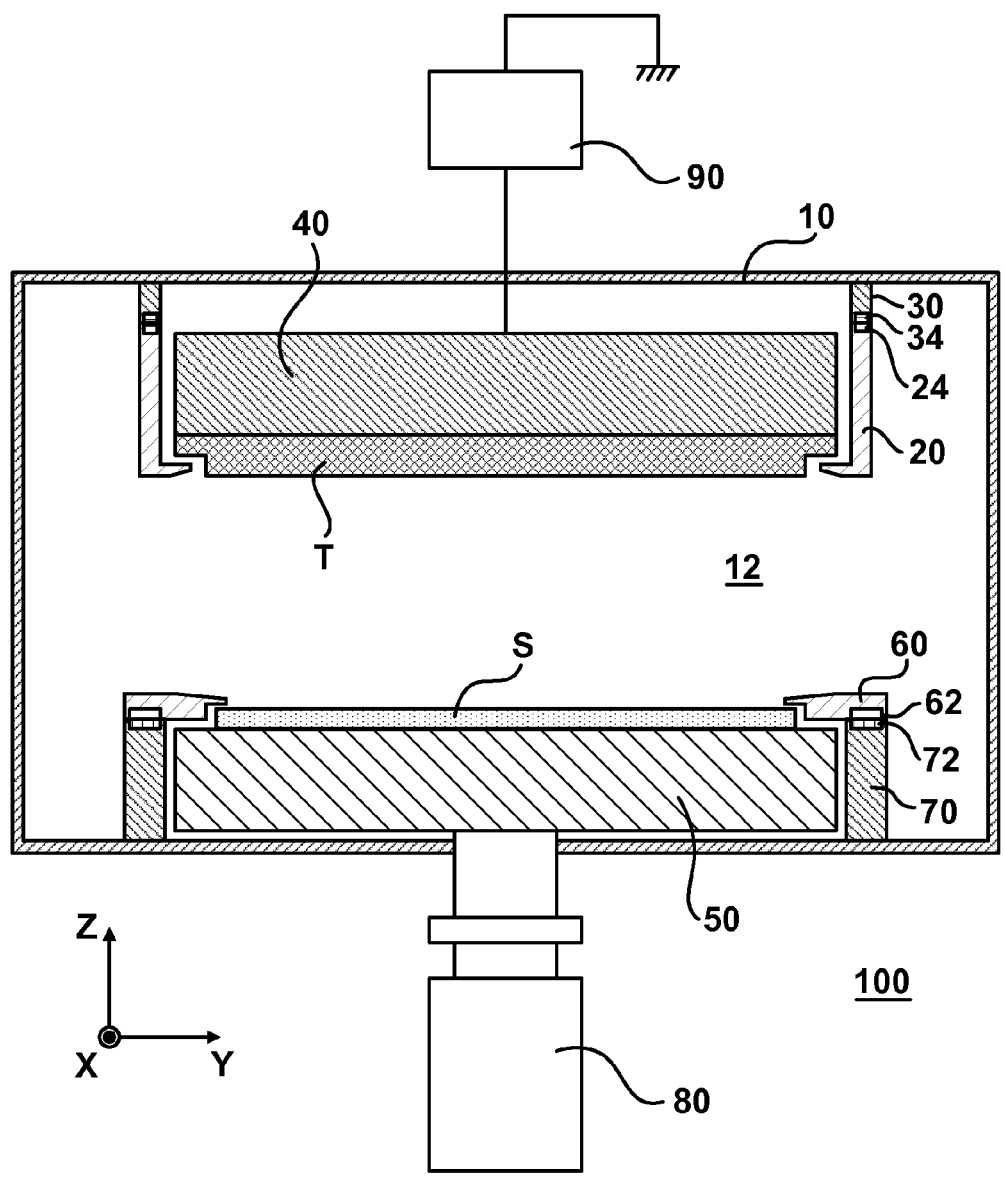

F I G. 2
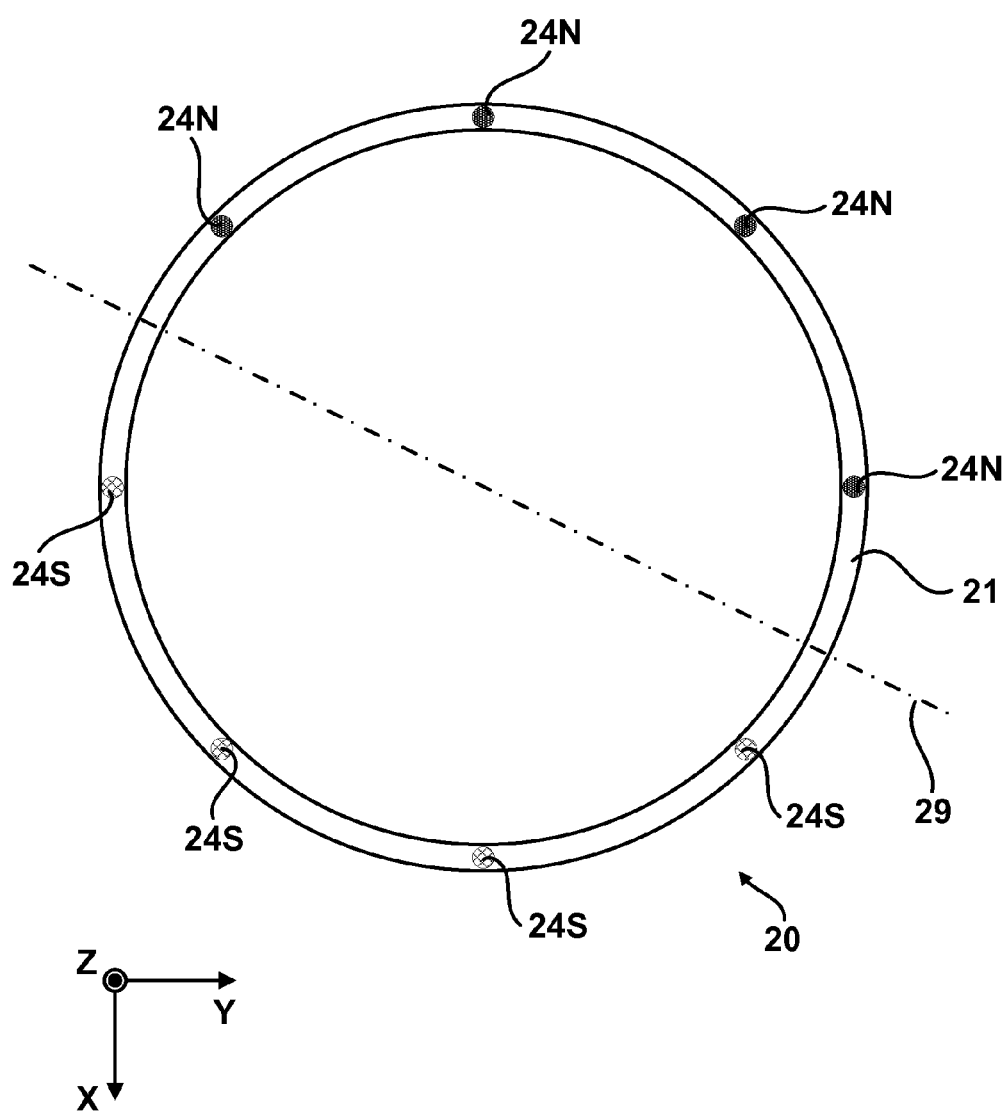

PROCESSING APPARATUS AND SHIELD

This application is a continuation of International Patent Application No. PCT/JP2012/006743 filed on Oct. 22, 2012, and claims priority to Japanese Patent Application No. 2011-275072 filed on Dec. 15, 2011, the entire content of both of which is incorporated herein by reference.

TECHNICAL FIELD

The present invention relates to a processing apparatus for processing a substrate in a vacuum processing space in a chamber, and a shield that can be built in the processing apparatus

BACKGROUND ART

PTL 1 discloses, in a sputtering apparatus, embedding a magnet piece in a cylindrical protecting plate (shield) and forming a cover plate, to which the cylindrical protecting plate should be fixed, using a magnetic substance, thereby fixing the cylindrical protecting plate to the cover plate by a magnetic force.

CITATION LIST

Patent Literature

PTL 1: Japanese Patent Laid-Open No. 3-6365

SUMMARY OF INVENTION

Technical Problem

To fix a shield by a magnetic force, an appropriate magnetic force is needed to prevent the shield from dropping or unexpectedly moving. However, when the magnetic force is strong, the detachment of the shield is difficult, and workability in maintenance lowers.

The present invention has been made in consideration of the above problem, and has as its object to provide a technique advantageous in improving the efficiency of a shield detachment operation.

Solution to Problem

According to a first aspect of the present invention, there is provided a processing apparatus for processing a substrate in a vacuum processing space in a chamber, and the processing apparatus comprises a shield capable of being arranged in the chamber, and a holding portion configured to hold the shield by a magnetic force, wherein the holding portion has a holding surface on which a first magnet is arranged, the shield includes a second magnet configured to generate an attraction force with respect to the first magnet, and a receiving portion configured to receive a tool configured to move the shield with respect to the holding portion, the shield is configured to be movable with respect to the holding portion against the magnetic force acting between the first magnet and the second magnet, and when the shield is moved with respect to the holding portion using the tool, the magnetic force acting between the first magnet and the second magnet weakens, and the shield is detachable from the holding portion.

According to a second aspect of the present invention, there is provided a shield configured to be arranged in a chamber of a processing apparatus for processing a substrate, and the shield comprises a magnet configured to fix the shield in the chamber, and a receiving portion configured to receive a tool configured to move the shield in the chamber.

Advantageous Effects of Invention

According to the present invention, there is provided a technique advantageous in improving the efficiency of a shield detachment operation.

Other features and advantages of the present invention will be apparent from the following descriptions taken in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 1 is a view showing the schematic arrangement of a processing apparatus according to an embodiment of the present invention;

FIG. 2 is a view showing a shield;

DESCRIPTION OF EMBODIMENTS

Figure 3:
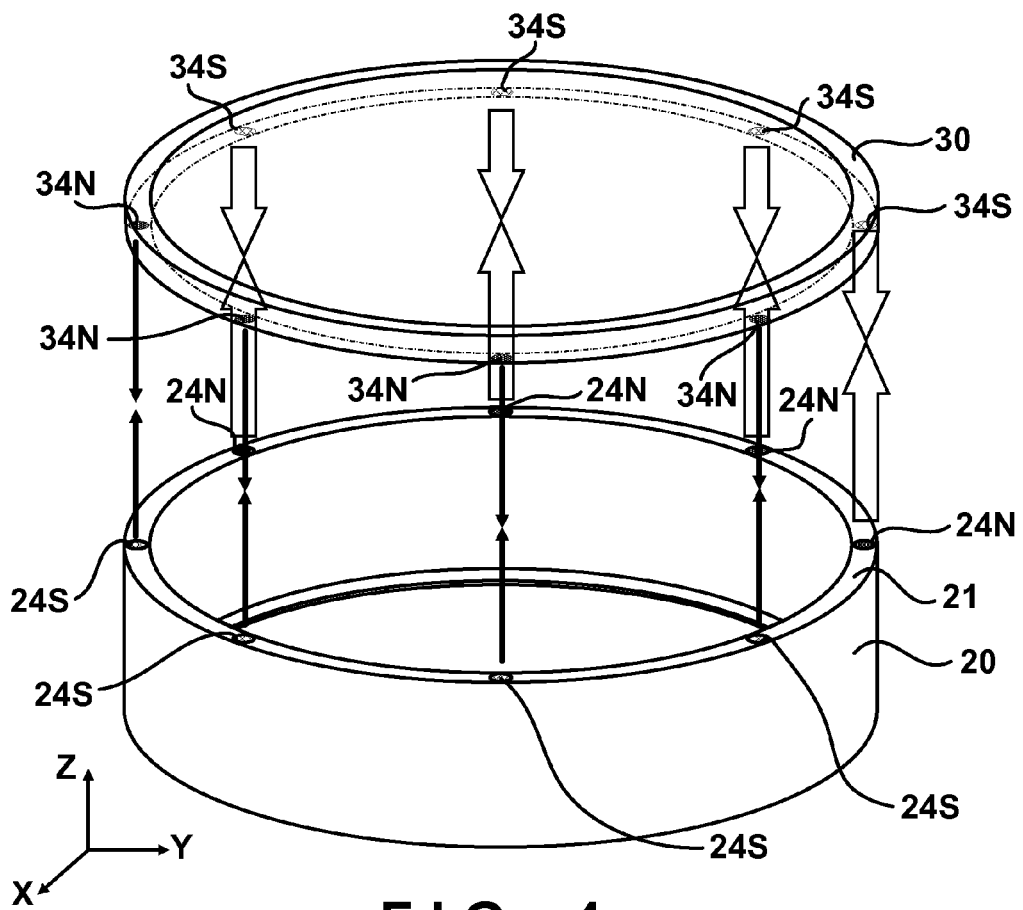
FIG. 3 is a view for explaining shield attachment to a holding portion.

An embodiment of the present invention will now be described with reference to the accompanying drawings.

FIG. 1 shows the schematic arrangement of a processing apparatus 100 according to the embodiment of the present invention. The processing apparatus 100 can be configured to process a substrate S in a vacuum processing space 12 in a chamber 10. The processing apparatus 100 can be formed as, for example, a sputtering apparatus, a CVD apparatus, a plasma processing apparatus, or the like. To give a more specific example, the processing apparatus 100 formed as a sputtering apparatus will be explained below. However, this is not intended to limit the scope of the present invention.

The processing apparatus 100 includes shields 20 and 60 arranged in the chamber 10, and holding portions 30 and 70 that hold the shields 20 and 60, respectively, by a magnetic force. The shield 20 can be arranged to surround a target T. The shield 60 can be arranged to surround the substrate S. The present invention is applicable to at least one of the shields 20 and 60. However, the shape and arrangement of a shield are not limited to the form shown in FIG. 1. The present invention is applicable to various arrangements that arrange a shield in a chamber. For example, the present invention is applicable to an arrangement that arranges a shield so as to surround the space between the target T and the substrate S.

The holding portion 30 has a holding surface on which a first magnet 34 is arranged. The first magnet 34 can be exposed to the holding surface of the holding portion 30, or not. The shield 20 includes a second magnet 24 that generates an attraction force with respect to the first magnet 34. The second magnet 24 can be exposed to the end face (a surface contacting or facing the holding portion 30) of the shield 20 or not.

The target T can be fixed to a backing plate 40. The backing plate 40 is cooled by a cooling unit (not shown). This can cool the target T. The backing plate 40 can also function as an electrode to which a voltage is applied from a power supply 90. The shield 20 can be arranged so as to surround the target T typically and the backing plate 40 as well wholly or partially.

The substrate S can be held by a substrate holding portion 50. The substrate holding portion 50 can be rotatably driven by a driving unit 80. In this embodiment, the processing apparatus 100 is formed as a sputtering apparatus, and a film is formed on the substrate S by sputtering. More specifically, ions generated by discharge caused by a voltage applied between the substrate holding portion 50 holding the substrate S and the backing plate 40 collide against the target T, and the target T emits particles. When the particles are deposited on the substrate S, a film is formed on the substrate S. Particles from the target 5 can be deposited and form a deposit on the shields 20 and 60 as well as the substrate S. Before the deposit exceeds the allowable level, the shields 20 and 60 are detached from the holding portions 30 and 70, and the new shields 20 and 60 or cleaned shields 20 and 60 are attached to the holding portions 30 and 70, respectively. The processing space 12 can be exhausted and depressurized by an exhaust device such as a turbo molecular pump (not shown). A sputter gas (for example, argon) can be introduced into the processing space 12 via a gas supply portion (not shown).

The processing apparatus 100 can include a magnet that provides a magnetic field around the target T, and can be formed as a magnetron sputtering apparatus. The magnet can be arranged such that the backing plate 40 is sandwiched between the magnet and the target T.

As shown in FIGS. 2 and 3, the magnet 24 provided on the shield 20 can include one or a plurality of magnets 24N each arranged with a magnetic pole (for example, N pole) having the first polarity facing outside (that is, the side of the holding portion 30), and one or a plurality of magnets 24S each arranged with a magnetic pole (for example, S pole) having the second polarity facing outside (that is, the side of the holding portion 30). As shown in FIG. 3, the magnet 34 provided on the holding portion 30 can include one or a plurality of magnets 34N each arranged with a magnetic pole (for example, N pole) having the first polarity facing outside (that is, the side of the shield 20), and one or a plurality of magnets 34S each arranged with a magnetic pole (for example, N pole) having the second polarity facing outside (that is, the side of the shield 20).

Figure 4:
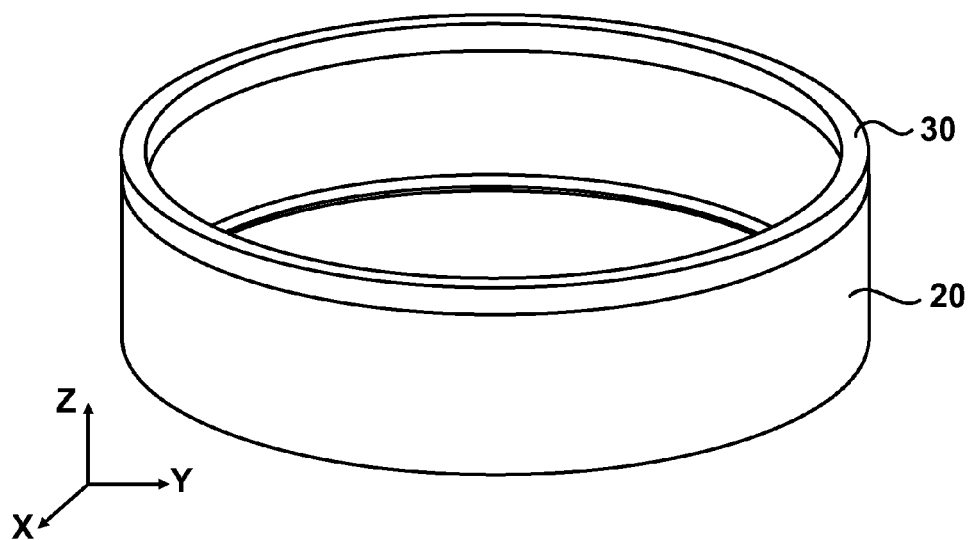
FIG. 4 is a view showing a state in which the shield is attached to the holding portion.

As shown in FIG. 3, the shield 20 is attached to the holding portion 30 such that the magnets 24N of the shield 20 face the magnets 34S of the holding portion 30, and the magnets 24S of the shield 20 face the magnets 34N of the holding portion 30. FIG. 4 shows a state in which the shield 20 is attached to the holding portion 30. Preferably, the one or plurality of magnets 24N of the shield 20 are arranged on one side of a line 29 passing through the center of the shield 20, and the one or plurality of magnets 24S of the shield 20 are arranged on the other side of the line 29, as shown in FIG. 2. In correspondence with this, preferably, the one or plurality of magnets 34N of the holding portion 30 are arranged on one side of a line passing through the center of the holding portion 30, and the one or plurality of magnets 34S of the holding portion 30 are arranged on the other side of the line. According to this arrangement, the attachment direction of the shield 20 to the holding portion 30 is uniquely determined. It is therefore possible to prevent an error in the attachment direction of the shield 20.

A magnet 62 of the shield 60 and a magnet 72 of the holding portion 70 on the side of the substrate S can also be arranged like the magnet 24 of the shield 20 and the magnet 34 of the holding portion 30 on the side of the target T. An operation of detaching the shield 20 from the holding portion 30 and the arrangements of the shield 20 and the holding portion 30 for the operation will be described below, which are also applicable to the shield 60 and the holding portion 70.

Figure 6:
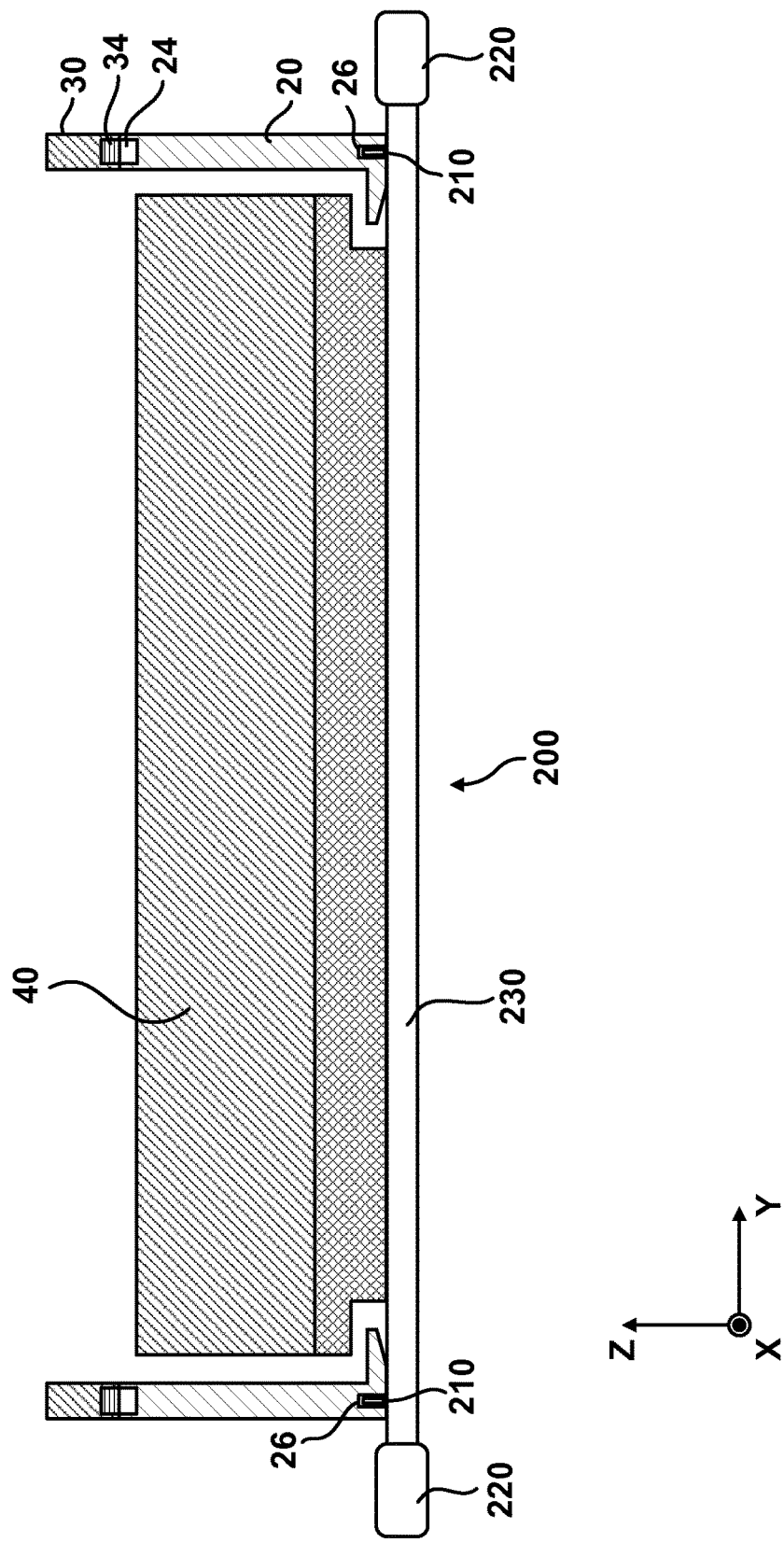
FIG. 6 is a view for explaining the first embodiment.
Figure 7:
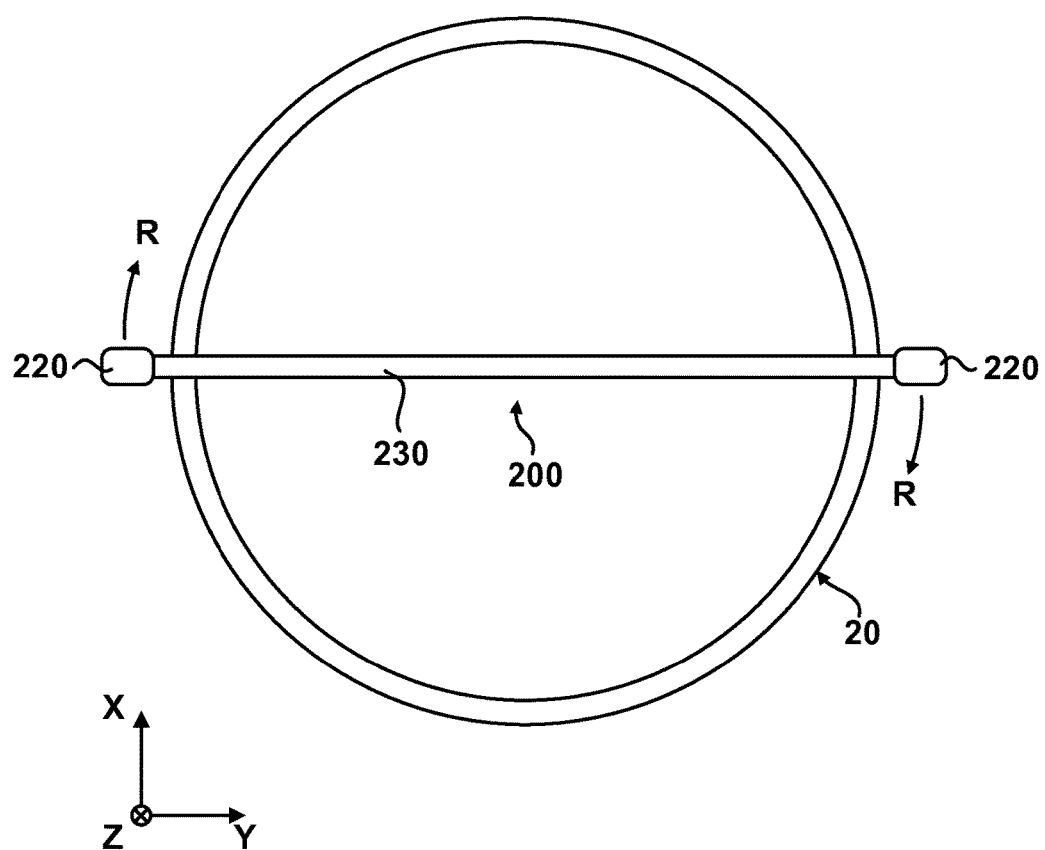
FIG. 7 is a view for explaining the first embodiment.
Figure 8:
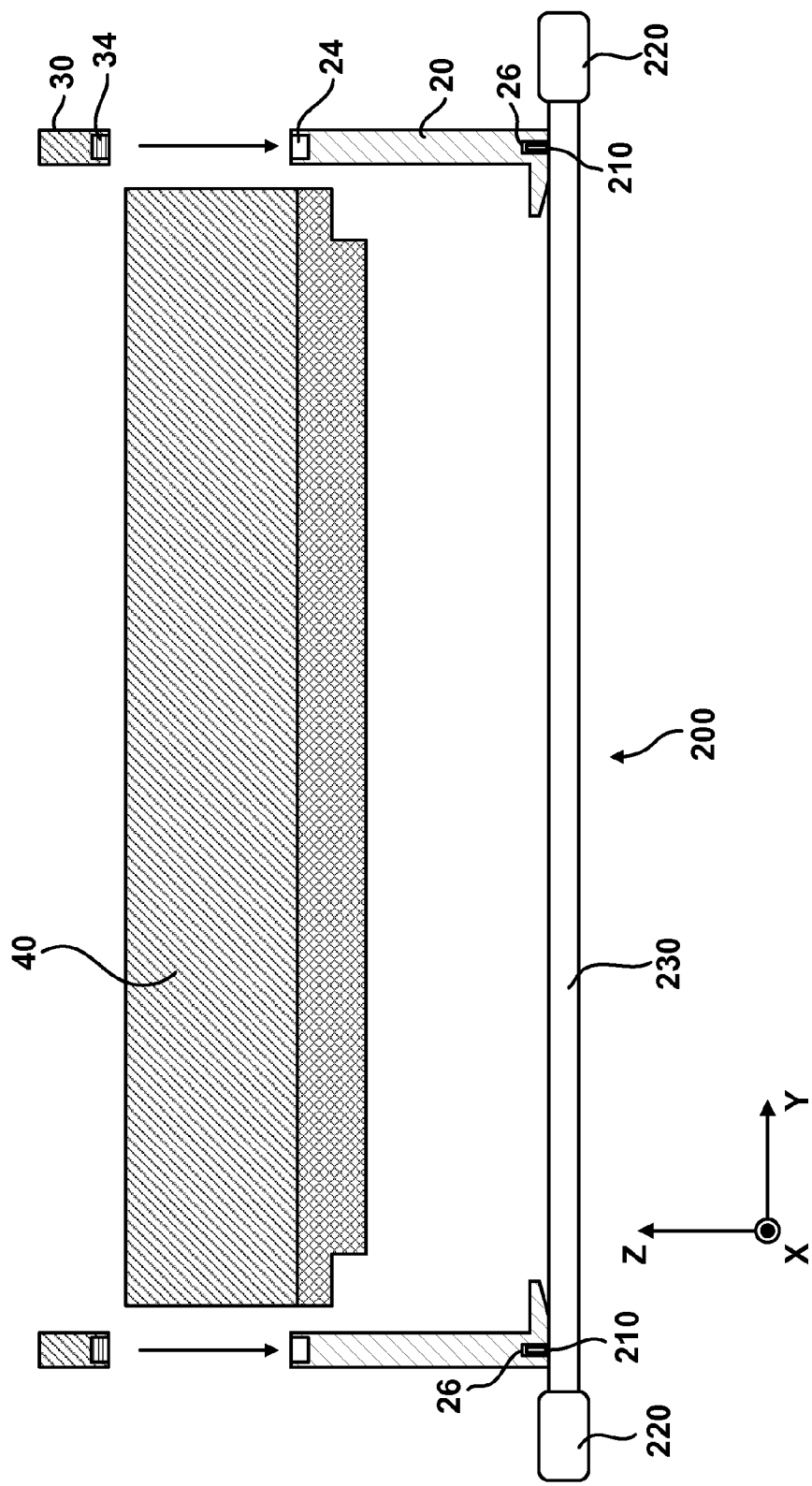
FIG. 8 is a view for explaining the first embodiment.

An operation of detaching the shield 20 from the holding portion 30 according to the first embodiment will be described with reference to FIGS. 6 to 8. As shown in FIG. 6, the shield 20 can have receiving portions 26 that receive a tool 200 configured to move the shield 20 with respect to the holding portion 30. The shield 20 can be configured to be able to move the shield 20 with respect to the holding portion 30 against the magnetic force acting between the first magnet 24 (24N and 24S) of the shield 20 and the second magnet 34 (34N and 34S) of the holding portion 30. When the shield 20 is moved with respect to the holding portion 30 using the tool 200, the magnetic force acting between the first magnet 24 (24N and 24S) of the shield 20 and the second magnet 34 (34N and 34S) of the holding portion 30 weakens at this time, and the shield 20 can easily be detached from the holding portion 30.

In the first embodiment, the receiving portion 26 provided in the shield 20 includes a hole serving as a first engaging portion. The tool 200 includes a pin 210 serving as a second engaging portion that engages with the hole of the receiving portion 26 serving as the first engaging portion. The tool 200 includes, for example, a support member 230 and handle portions 220 provided at both ends of the support member 230. The pin 210 can be provided on the support member 230. In the first embodiment, the receiving portions 26 of the shield 20 include two holes, and the tool 200 includes two pins 210 corresponding to them.

Figure 5:
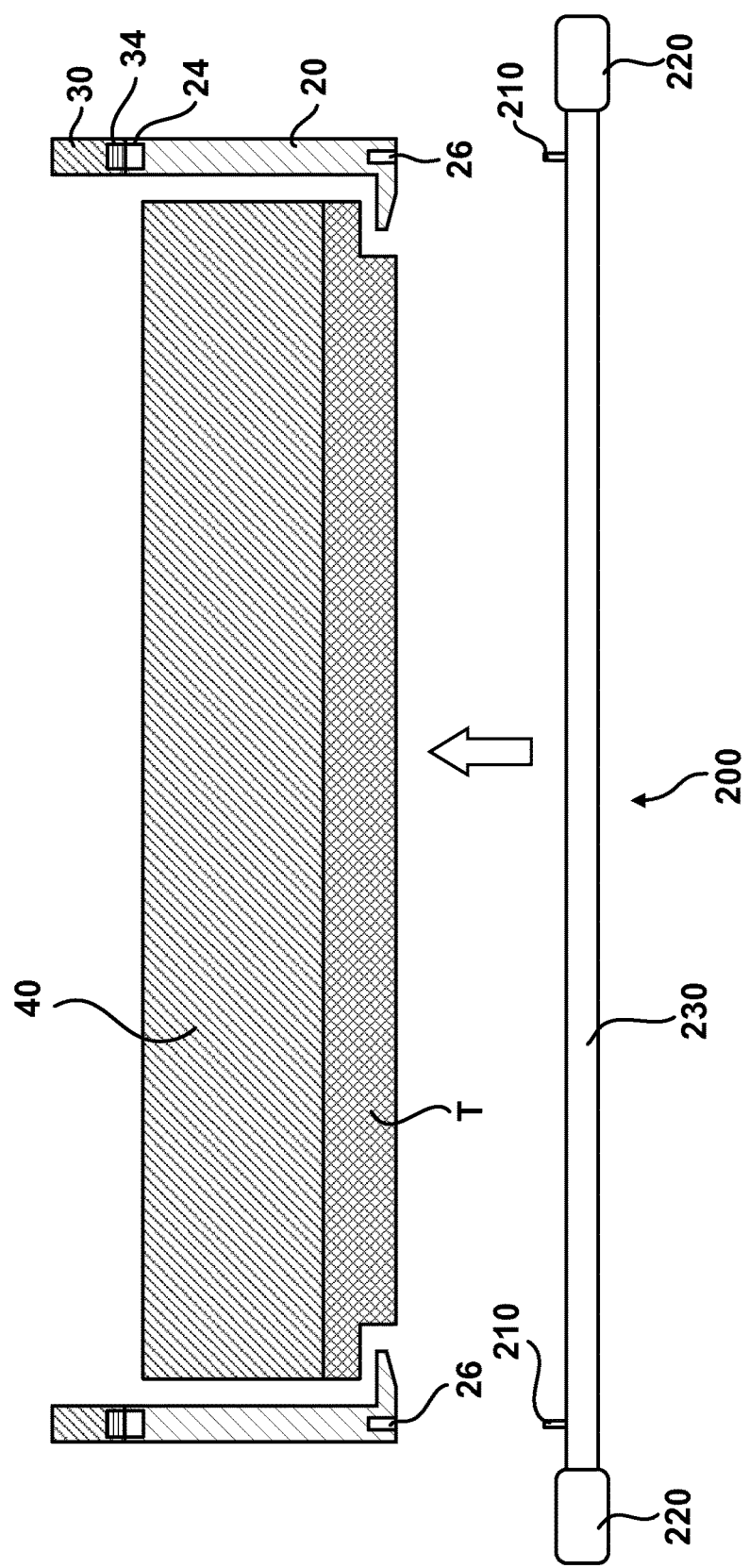
FIG. 5 is a view for explaining the first embodiment.

The shield 20 can rotate with respect to the holding portion 30. When the pins 210 of the tool 200 are engaged with the holes serving as the receiving portions 26 of the shield 20, as shown in FIGS. 5 and 6, and the tool 200 is rotated in a rotation direction R, as shown in FIG. 7, the magnetic force acting between the first magnet 24 (24N and 24S) of the shield 20 and the second magnet 34 (34N and 34S) of the holding portion 30 weakens. The shield 20 can thus easily be detached from the holding portion 30, as shown in FIG. 8.

Figure 9:
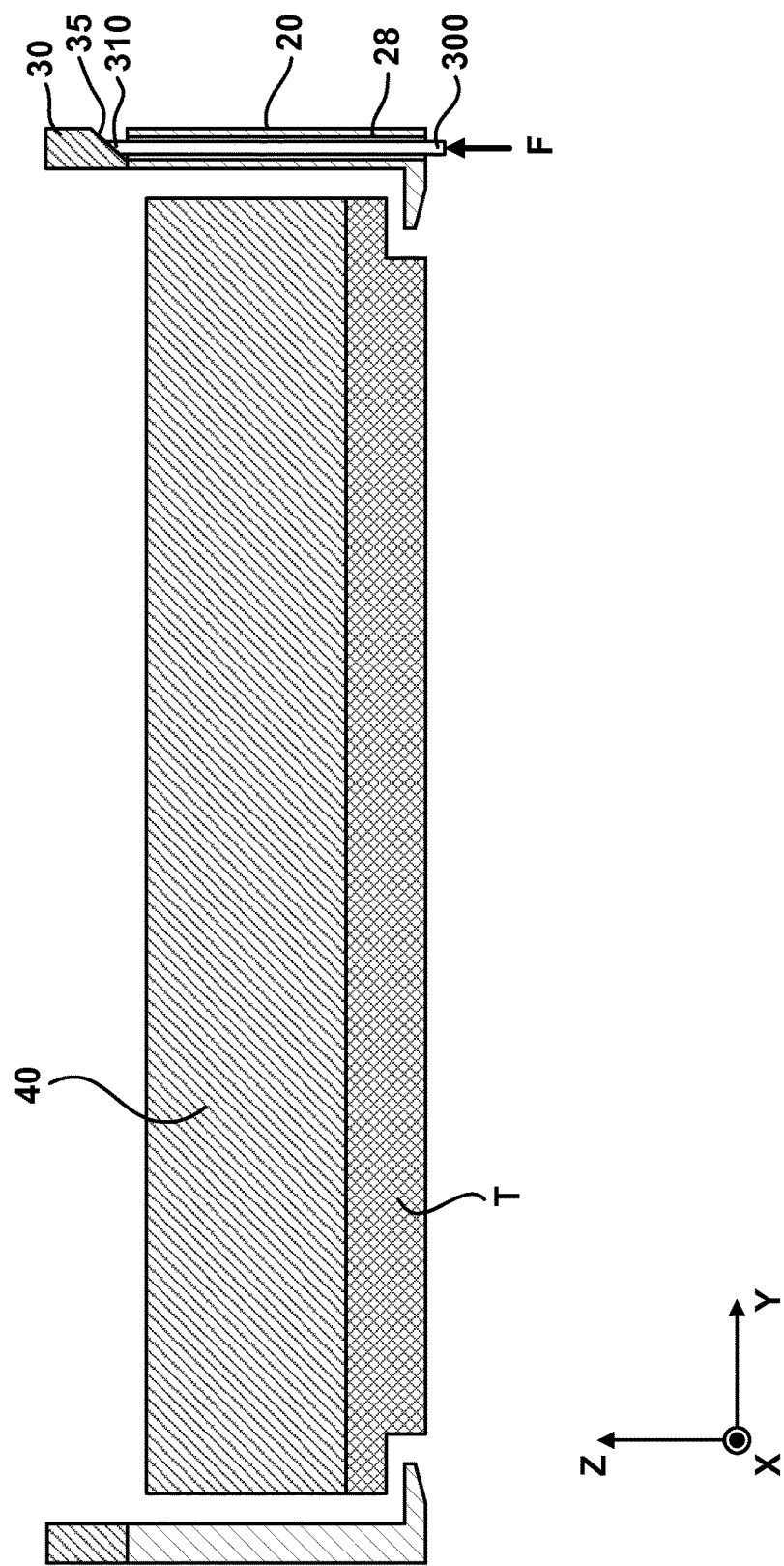
FIG. 9 is a view for explaining the second embodiment.
Figure 10:
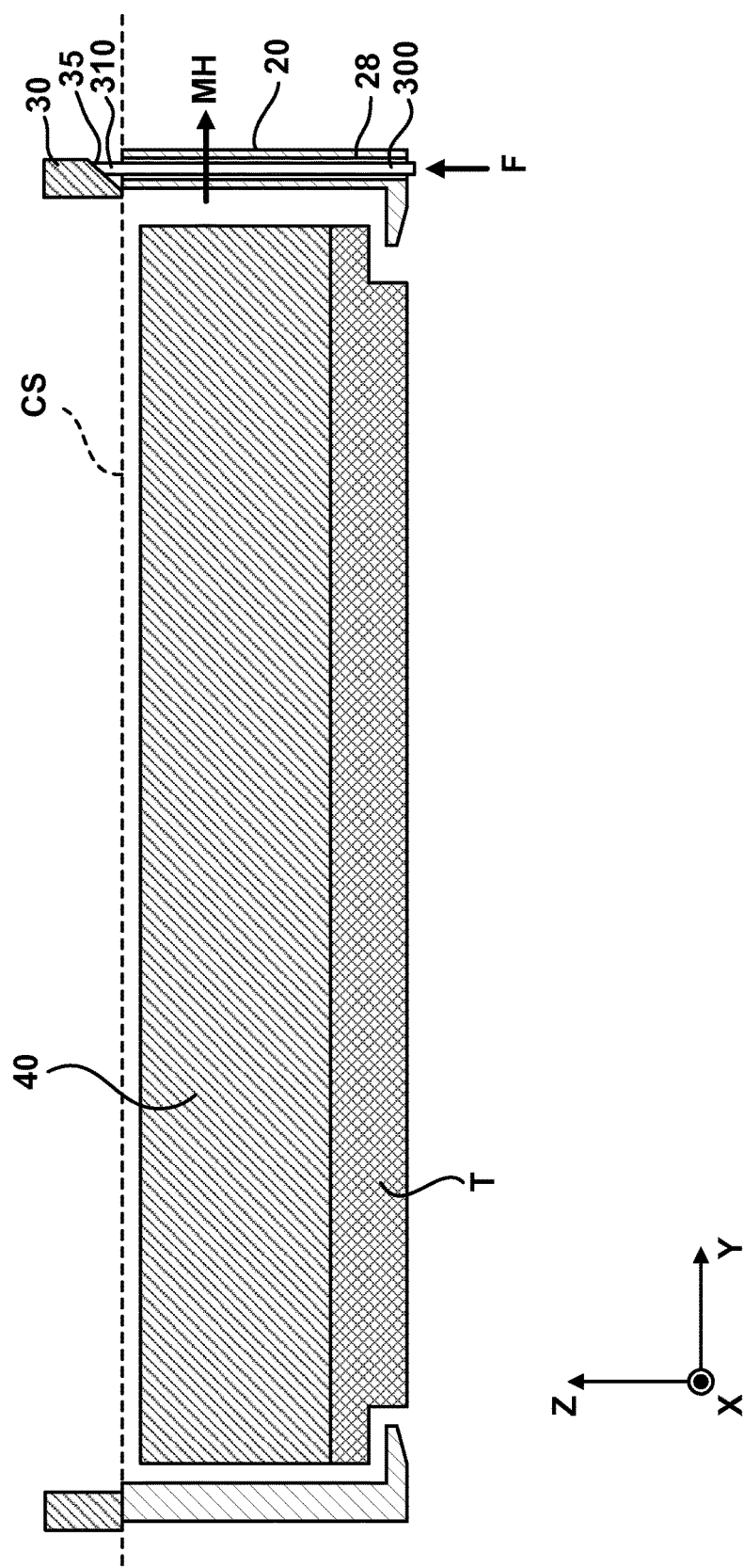
FIG. 10 is a view for explaining the second embodiment.

An operation of detaching a shield 20 from a holding portion 30 according to the second embodiment will be described with reference to FIGS. 9 and 10. As shown in FIGS. 9 and 10, the shield 20 can have a receiving portion 28 that receives a tool 300 configured to move the shield 20 with respect to the holding portion 30. In the second embodiment, the tool 300 includes a rod-shaped portion, and the receiving portion 28 provided in the shield 20 includes a through hole that extends through the shield 20 so as to receive the rod-shaped portion of the tool 300. The holding portion 30 includes a butt surface 35 configured to make a force act on the shield 20 so as to move it with respect to the holding portion 30 when the rod-shaped portion of the tool 300 is pressed against the butt surface 35. A distal end 310 of the rod-shaped portion of the tool 300 can be configured to smoothly come into contact with the butt surface 35.

When a force F is applied to the tool 300 so as to press the distal end 310 of the tool 300 against the butt surface 35 of the holding portion 30, as shown in FIG. 9, the tool 300 moves along the butt surface 35, and the shield 20 accordingly moves with respect to the holding portion 30. That is, the through hole serving as the receiving portion 28 and the butt surface 35 of the holding portion 30 are configured such that the movement of the shield 20 with respect to the holding portion 30 includes movement MH of the shield 20 in a direction parallel to a contact surface CS between the holding portion 30 and the shield 20. The movement of the shield 20 with respect to the holding portion 30 may include movement of the shield 20 in a direction other than the direction parallel to the contact surface CS.

A thread may be formed entirely or partially in the through hole of the receiving portion 28, and a thread that engages with that of the through hole may be formed on the rod-shaped portion of the tool 300 such that the tool 300 moves in the axial direction of the through hole as the rod-shaped portion of the tool 300 is rotated. When the tool 300 moves in the axial direction of the through hole, the distal end 310 of the tool 300 is pressed against the butt surface 35. This can make the shield 20 easily detachable from the holding portion 30 by a small force.

Figure 11:
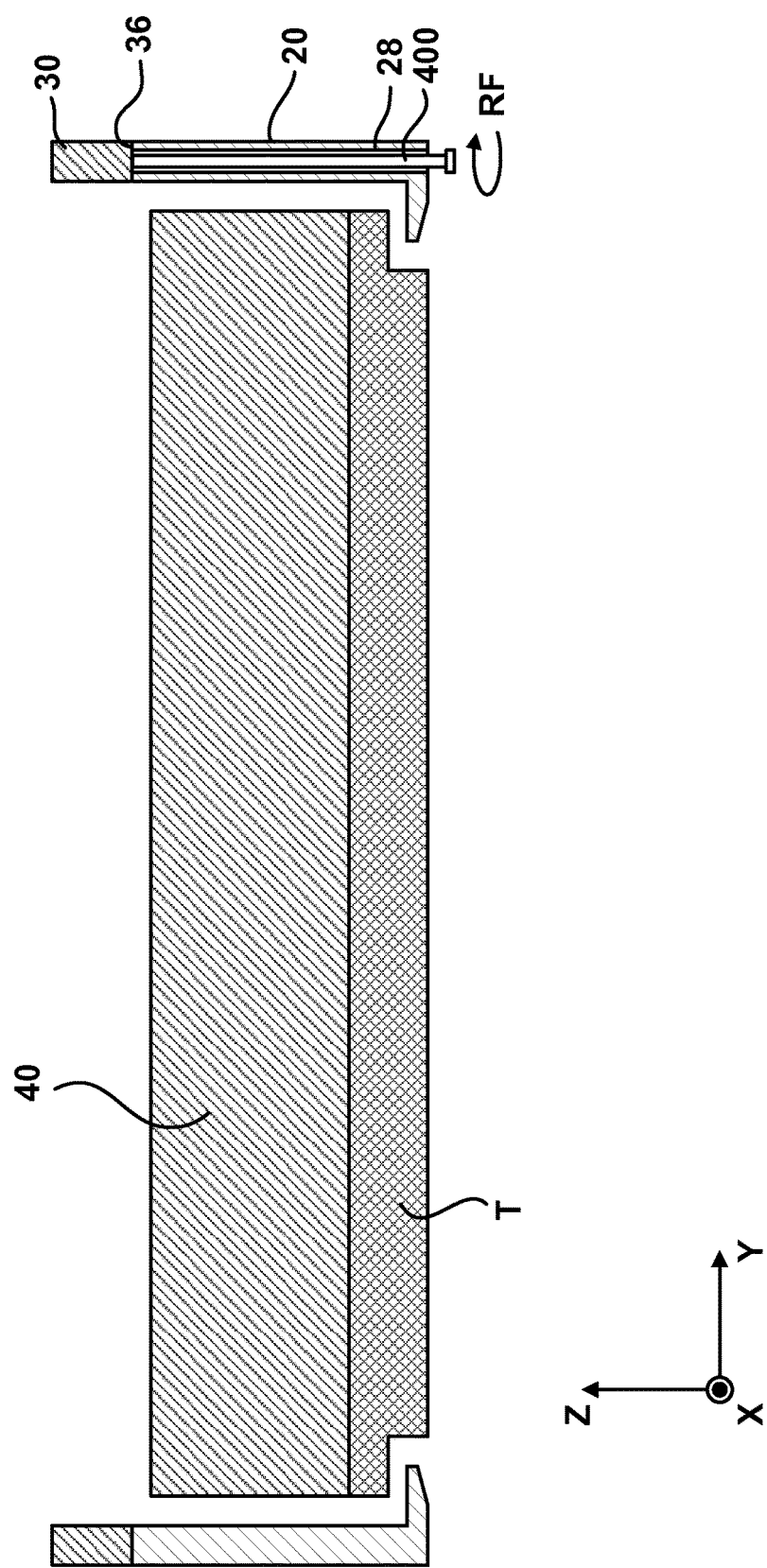
FIG. 11 is a view for explaining the third embodiment.
Figure 12:
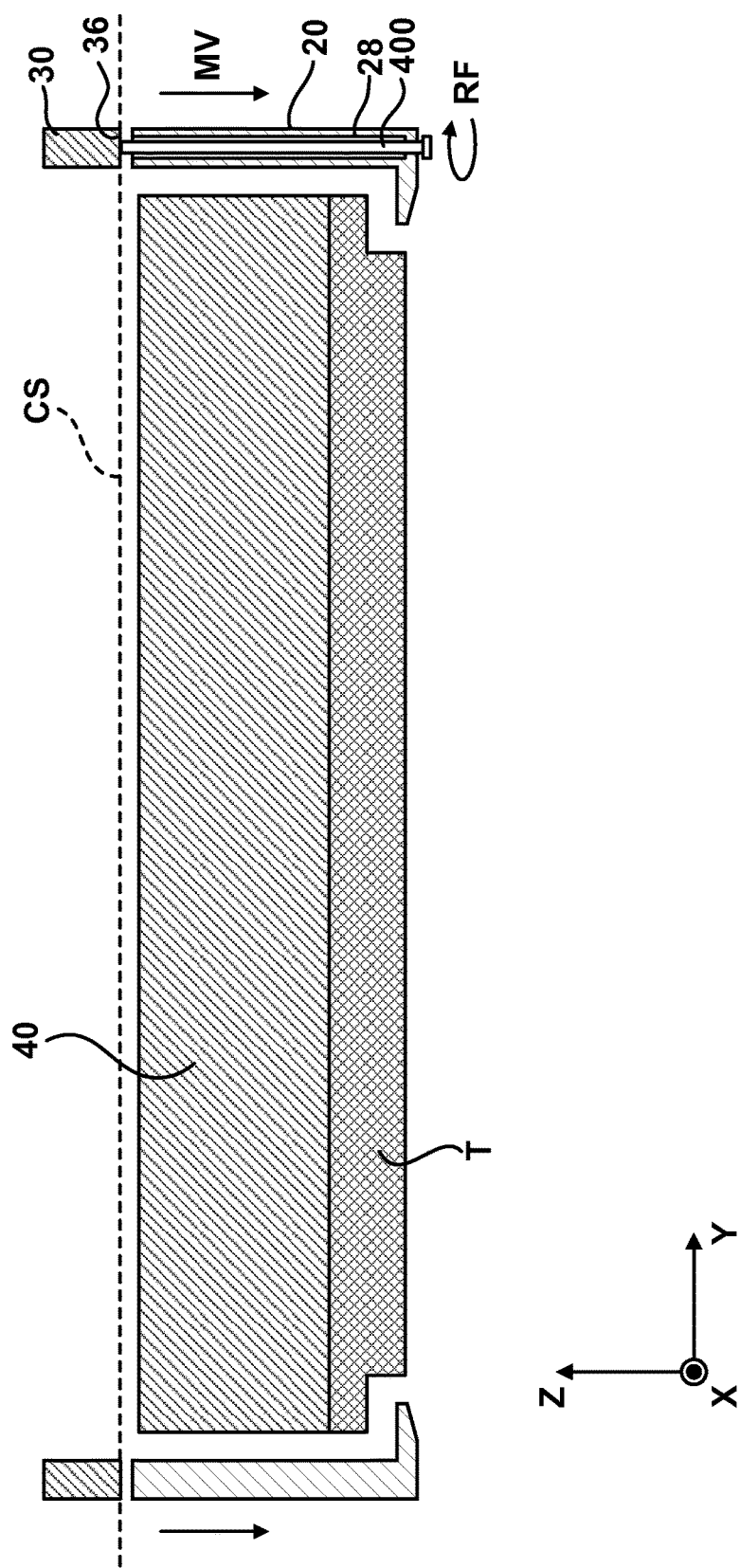
FIG. 12 is a view for explaining the third embodiment.

An operation of detaching a shield 20 from a holding portion 30 according to the third embodiment will be described with reference to FIGS. 11 and 12. As shown in FIGS. 11 and 12, the shield 20 can have a receiving portion 28 that receives a tool 400 configured to move the shield 20 with respect to the holding portion 30. In the third embodiment, the tool 400 includes a rod-shaped portion, and the receiving portion 28 provided in the shield 20 includes a through hole that extends through the shield 20 so as to receive the rod-shaped portion of the tool 400. The holding portion 30 includes a butt surface 36 configured to make a force act on the shield 20 so as to move it with respect to the holding portion 30 when the rod-shaped portion of the tool 400 is pressed against the butt surface 36.

A thread is formed entirely or partially in the through hole of the receiving portion 28, and a thread that engages with that of the through hole may be formed on the rod-shaped portion of the tool 400. When the rod-shaped portion of the tool 400 is rotated, as indicated by RF in FIG. 11, the distal end of the tool 400 is pressed against the butt surface 36. At this time, a force acts in a direction to separate the shield 20 from the holding portion 30. That is, the through hole serving as the receiving portion 28 and the butt surface 36 of the holding portion 30 are configured such that the movement of the shield 20 with respect to the holding portion 30 includes movement MV of the shield 20 in a direction perpendicular to a contact surface CS between the holding portion 30 and the shield 20. Note that the movement of the shield 20 with respect to the holding portion 30 may include movement of the shield 20 in a direction other than the direction perpendicular to the contact surface CS.

The present invention is not limited to the above embodiment and various changes and modifications can be made within the spirit and scope of the present invention. Therefore, to apprise the public of the scope of the present invention, the following claims are made.

The invention claimed is:

1. A processing apparatus for processing a substrate in a vacuum processing space in a chamber, the apparatus comprising:
a shield capable of being arranged in the chamber; and
a holding portion configured to hold the shield by a magnetic force,
wherein the holding portion has a holding surface and a first magnet,
the shield includes a second magnet configured to generate an attraction force with respect to the first magnet, and a receiving portion configured to receive a tool configured to apply a force to move the shield with respect to the holding portion,
the shield is configured to be movable with respect to the holding portion against the magnetic force acting between the first magnet and the second magnet, and
when the shield is moved with respect to the holding portion using the tool, the magnetic force acting between the first magnet and the second magnet weakens, and the shield is detachable from the holding portion.

2. The processing apparatus according to claim 1, wherein the shield is rotatable about an axis perpendicular to a contact surface between the holding portion and the shield, and movement of the shield with respect to the holding portion includes rotation of the shield.

3. The processing apparatus according to claim 2, wherein the receiving portion includes an engaging portion with which the tool engages to rotate the shield.

4. The processing apparatus according to claim 1, wherein the tool includes a rod-shaped portion,
the receiving portion has a through hole that extends through the shield so as to receive the rod-shaped portion of the tool, and
the holding portion includes a butt surface configured to make a force act on the shield so as to move the shield with respect to the holding portion when the rod-shaped portion is pressed against the butt surface.

5. The processing apparatus according to claim 4, wherein the receiving portion has a thread, the rod-shaped portion has a thread that engages with the thread of the receiving portion, and when the rod-shaped portion is rotated, the rod-shaped portion is pressed against the butt surface.

6. The processing apparatus according to claim 4, wherein the through hole and the butt surface are configured such that movement of the shield with respect to the holding portion includes movement of the shield in a direction parallel to a contact surface between the holding portion and the shield.

7. The processing apparatus according to claim 4, wherein the through hole and the butt surface are configured such that movement of the shield with respect to the holding portion includes movement of the shield in a direction perpendicular to a contact surface between the holding portion and the shield.

8. The processing apparatus according to claim 1, wherein the processing apparatus is formed as a sputtering apparatus, and the shield is configured to surround a target.

9. A shield configured to be arranged in a chamber of a processing apparatus for processing a substrate, the shield comprising:
a surface which is held by a holding portion, which holding portion is arranged in the chamber to hold the shield;
a first magnetic pole arranged in an area of the surface;
a second magnetic pole, which is different from the first magnetic pole, and is arranged in another area of the surface; and
a receiving portion configured to receive a tool which is configured to apply a force to move the shield, with respect to the holding portion, in the chamber.

10. The shield according to claim 9, wherein the shield includes a contact surface configured to come into contact with a holding portion provided in the processing apparatus so as to hold the shield in the chamber, and movement of the shield in the chamber includes rotation of the shield about an axis perpendicular to the contact surface.

11. The shield according to claim 10, wherein the receiving portion includes an engaging portion with which the tool engages to rotate the shield.

12. The shield according to claim 9, wherein the receiving portion has a through hole that extends through the shield so as to receive a rod-shaped portion of the tool including the rod-shaped portion.

13. The shield according to claim 12, wherein the receiving portion has a thread that engages with a thread formed on the rod-shaped portion so as to move the rod-shaped portion in an axial direction of the through hole when the rod-shaped portion is rotated.

14. The shield according to claim 12, wherein the shield includes a contact surface configured to come into contact with a holding portion provided in the processing apparatus so as to hold the shield in the chamber, and the through hole is configured such that movement of the shield in the chamber includes movement of the shield in a direction parallel to the contact surface.

15. The shield according to claim 12, wherein the shield includes a contact surface configured to come into contact with a holding portion provided in the processing apparatus so as to hold the shield in the chamber, and the through hole is configured such that movement of the shield in the chamber includes movement of the shield in a direction perpendicular to the contact surface.

16. The shield according to claim 9, wherein the processing apparatus is formed as a sputtering apparatus, and the shield is configured to surround a target.

17. The processing apparatus according to claim 1, wherein the processing apparatus includes the tool configured to move the shield, and the tool includes a member that is movable with respect to the holding portion.

18. The processing apparatus according to claim 1, wherein the first magnet is arranged in the holding portion such that at least one first magnetic pole is arranged in a half area of the holding surface and at least one second magnetic pole different from the first magnetic pole is arranged in another half area of the holding surface, and wherein the shield has a held surface which is held by the holding surface of the holding portion, the second magnet is arranged in the shield such that at least the first magnetic pole is arranged in a half area of the held surface and at least the second magnetic pole different from the first magnetic pole is arranged in another half area on the held surface.

19. The shield according to claim 9, wherein the shield includes the tool configured to move the shield, and the tool includes a member that is movable with respect to the components in the chamber.

20. The shield according to claim 9, wherein the first magnet pole is arranged in the holding portion such that at least one first magnetic pole is arranged in a half area of the holding portion and at least one second magnetic pole different from the first magnetic pole is arranged in another half area of the holding portion, and Wherein in the surface of the shield which is held by the holding portion, the second magnet is arranged such that at least the first magnetic pole is arranged in a half area of the held surface and at least the second magnetic pole different from the first magnetic pole is arranged in another half area on the held surface.

* * * * *